US010685945B2

United States Patent
Robin et al.

(10) Patent No.: US 10,685,945 B2
(45) Date of Patent: Jun. 16, 2020

(54) ILLUMINATED FACEPLATE AND METHOD FOR PRODUCING SUCH AN ILLUMINATED FACEPLATE

(71) Applicant: Commissariat a l'Energie Atomique et aux Energies Alternatives, Paris (FR)

(72) Inventors: Ivan-Christophe Robin, Grenoble (FR); Bruno Mourey, Coublevie (FR)

(73) Assignee: Commissariat a l'Energie Atomique et aux Energies (FR)

( * ) Notice: Subject to any disclaimer, the term of this patent is extended or adjusted under 35 U.S.C. 154(b) by 0 days.

(21) Appl. No.: 15/754,539

(22) PCT Filed: Nov. 15, 2016

(86) PCT No.: PCT/FR2016/052957
§ 371 (c)(1),
(2) Date: Feb. 22, 2018

(87) PCT Pub. No.: WO2017/089676
PCT Pub. Date: Jun. 1, 2017

(65) Prior Publication Data
US 2018/0247922 A1    Aug. 30, 2018

(30) Foreign Application Priority Data

Nov. 26, 2015  (FR) .................................. 15 61421

(51) Int. Cl.
*H01L 25/16*     (2006.01)
*H01L 33/00*     (2010.01)
(Continued)

(52) U.S. Cl.
CPC ........ *H01L 25/167* (2013.01); *H01L 21/6835* (2013.01); *H01L 25/0753* (2013.01);
(Continued)

(58) Field of Classification Search
CPC .................................................... H01L 25/167
(Continued)

(56) References Cited

U.S. PATENT DOCUMENTS 6,071,795 A    6/2000  Cheung et al.
8,898,896 B2  12/2014  Marion et al.
(Continued)

FOREIGN PATENT DOCUMENTS

CN    104282678 A    1/2015
FR      2928033         8/2009
(Continued)

OTHER PUBLICATIONS

H.W. Choi, et al, "Fabrication of matrix-addressable micro-LED arrays based on a novel etch technique", Journal of Crystal Growth, vol. 268, Issues 3-4, Aug. 1, 2004, pp. 527-530.

*Primary Examiner* — Hsin Yi Hsieh
(74) *Attorney, Agent, or Firm* — Forge IP, PLLC

(57) ABSTRACT

A luminous panel includes a substrate having electric connections and an array of microchips secured to the substrate and connected to the electric connections in order to be driven. Each microchip includes control circuit based on transistors formed in a silicon volume, the circuit being connected to the substrate connections, and a micro-LED secured to the control circuit and connected thereto in order to be controlled.

6 Claims, 6 Drawing Sheets

(51) Int. Cl.
*H01L 25/075* (2006.01)
*H01L 21/683* (2006.01)
*H01L 33/32* (2010.01)
*H01L 33/62* (2010.01)
*H01L 33/38* (2010.01)
*H01L 27/12* (2006.01)

(52) U.S. Cl.
CPC ........ *H01L 33/007* (2013.01); *H01L 33/0079* (2013.01); *H01L 33/32* (2013.01); *H01L 33/62* (2013.01); *H01L 27/124* (2013.01); *H01L 27/1255* (2013.01); *H01L 27/1266* (2013.01); *H01L 33/382* (2013.01); *H01L 2221/68368* (2013.01); *H01L 2221/68381* (2013.01); *H01L 2224/95001* (2013.01); *H01L 2224/97* (2013.01); *H01L 2933/0066* (2013.01)

(58) Field of Classification Search
USPC ........................................................ 438/107
See application file for complete search history.

(56) References Cited

U.S. PATENT DOCUMENTS

| | | |
|---|---|---|
| 9,093,607 B2 | 7/2015 | Gilet et al. |
| 9,666,756 B2 | 5/2017 | von Malm et al. |
| 9,768,350 B2 | 9/2017 | Bavencove et al. |
| 2010/0267176 A1 | 10/2010 | Liu et al. |
| 2014/0075747 A1 | 3/2014 | Marion |
| 2014/0120640 A1 | 5/2014 | Shieh et al. |
| 2014/0191246 A1 | 7/2014 | Oraw |
| 2016/0104743 A1 | 4/2016 | Tchelnokov et al. |

FOREIGN PATENT DOCUMENTS

| | | |
|---|---|---|
| WO | WO2008109296 A1 | 9/2008 |
| WO | WO2012035243 | 3/2012 |
| WO | WO2012156121 A1 | 11/2012 |
| WO | WO2012156620 | 11/2012 |
| WO | WO2013001225 | 1/2013 |
| WO | WO2014184488 A1 | 11/2014 |

ILLUMINATED FACEPLATE AND METHOD FOR PRODUCING SUCH AN ILLUMINATED FACEPLATE

FIELD OF THE INVENTION

The invention relates to luminous panels, in particular to display panels, for example, of computers, of smartphones, of television sets, of tablets, or of image projectors.

The invention more particularly relates to luminous panels based on inorganic microlight-emitting diodes ("micro-LEDs"), particularly on micro-LEDs based on gallium nitride ("GaN") or on derived materials.

BACKGROUND

Schematically, a luminous panel comprises an array of luminous elements, or pixels, individually controlled by an array of control circuits (or "active array"). Each control circuit comprises, to drive its associated pixel, one or a plurality of transistors, operating as switches, and most often a capacitor for maintaining the pixel biasing between two refreshments of the panel display.

To date, only two technologies enable to form luminous panels having large dimensions and a long lifetime, that is, the liquid crystal-based technology ("LCD"), and the plasma-based technology ("plasma" display panel). Each of these technologies however has a number of disadvantages, for example, a problem of power efficiency and of directivity for LCDs, and a problem of power consumption and of screen burn-in for plasma display panels.

Alternative technologies, particularly based on organic photodiodes (or "OLED"), have thus been developed, without however providing a satisfactory result. Indeed, OLED-based displays exhibit shine issues and have too short a lifetime, limiting their use to devices considered as having a short lifetime (particularly, smartphones).

In parallel, whatever the technologies envisaged for light generation (LCD, plasma, OLED, . . . ), the control circuits are manufactured in thin film deposition technology, called "TFT" ("thin film transistor"). The electronic components of the control circuits (particularly transistor(s), capacitor, electric tracks) are thus formed by successively depositing thin films of material and by using photolithography masks to delimit their components (electrodes, semiconductor layer, dielectric layer, tracks . . . ). For example, the manufacturing of the control circuits of an LCD, each only comprising one transistor and one capacitor, requires using from 5 to 9 photolithography masks. The cost of the control circuits manufactured according to this technology is thus very high. Further, the manufacturing of an active array of large dimension according to the conventional TFT technology substantially increases the cost of a screen due to the cost of the equipment enabling to deposit thin films on large surface areas. This is why it is estimated that only a few market operators, capable of investing in high-cost equipment, are now capable of bearing their cost.

SUMMARY OF THE SPECIFICATION

The present invention aims at providing a method of manufacturing a luminous panel, based on a light-emission technology other than the LCD, plasma, and OLED technologies, capable of forming a luminous panel at a decreased cost.

For this purpose, the invention aims at a method of manufacturing a luminous panel, comprising:

manufacturing a first substrate comprising:
  a stack of semiconductor layers forming inorganic semiconductor micro-LEDs; and
  an array of electric connections for the micro-LEDs, the manufacturing of the first substrate being carried out in such a way that the electric connections are arranged on a first surface of the first substrate;

manufacturing in a second silicon substrate, independently from the first substrate, an array of transistor-based circuits for controlling the micro-LEDs, said manufacturing being carried out so that:
  first connections for the control of the micro-LEDs are arranged on a first surface of the second substrate;
  and second connections for the driving of the luminous panel are arranged on a second surface of the second substrate;

placing the first surfaces of the first substrate and of the second substrate one on the other and securing said surfaces to each other, to electrically connect the electric connections of the micro-LEDs with the first electric connections of the control circuits, thus obtaining a third substrate comprising an array of electronic microchips, each formed of the stacking of a micro-LED and of a control circuit;

manufacturing a microchip transfer structure comprising:
  a transfer substrate;
  and the microchip array, each microchip being secured to the transfer substrate only by its micro-LED, and individualized by the forming of a trench into the third substrate around the microchip;

manufacturing a fourth substrate, independently from the transfer structure, comprising electric connections for supplying signals in order to drive the luminous panel, said connections being arranged on a first surface of the fourth substrate; and placing the transfer structure on the first surface of the fourth substrate, securing the microchips to the first surface of the fourth substrate to connect the second connections of the control circuits to the electric connections of the fourth substrate, and separating the microchips from the transfer substrate.

In other words, the luminous panel thus formed comprises an array of inorganic micro-LEDs, thus having a longer lifetime than OLEDs. Each micro-LED comprises a surface free of any electronic or electric component, unlike LCD panels, which have their liquid crystal partially masked by the active array, and unlike plasma panels, which have their plasma cells partially masked by electrodes. This especially explains the use of the TFT technology for LCD and plasma display panels since it enables to manufacture active arrays or electrodes of very small thickness, which are thus little disturbing.

Due to the layout of the micro-LEDs according to the invention, it is possible to do without this expensive technology. The active array of the invention is thus advantageously formed according to a technique conventional in microelectronics, for example, that, well-known, of ASIC circuits, for which the transistors are directly formed in the bulk of a silicon wafer, and not by successive depositions of layers of materials. It is thus possible to form luminous panels having dimensions at least equal to those of wafers usual in the field of electronic chip manufacturing (for example, wafers for the manufacturing of ASIC circuits), or even to form the panel from a plurality of wafers. The invention further enables to achieve, in the active array, any type of electronic diagram for the control of micro-LEDs. The active array of the invention may in particular be formed according to a diagram of the state of the art, each micro-LED being accordingly controlled in the same way as in the state of the art with individual control transistors, capacitors, etc. The advantages of this type of control (responsiveness, display quality, etc.) are thus kept. Unlike, however, the expensive TFT technology, which manufactures already-interconnected transistors, the transistors of the active array of the invention are interconnected after their manufacturing, after they are in place, by conductive tracks of a passive array.

Further, the invention implements the placing of substrates on one another. Now, substrate placings can be achieved by machines conventional in the field of microelectronics.

Eventually, a luminous panel in inorganic micro-LED technology having a low cost and a large surface area, if need be, is thus obtained.

According to an embodiment, the manufacturing of the microchip transfer structure comprises:
  placing and temporarily bonding the third substrate to the transfer substrate;
  then, forming the trenches around the microchips down to the transfer substrate.

In other words, the invention advantageously uses placings by means of a handle substrate.

As a variation:
  the manufacturing of the first substrate comprises manufacturing a growth substrate and growing by epitaxy semiconductor layers forming the micro-LEDs, the growth substrate forming the substrate of the microchip transfer structure;
  the manufacturing of the microchip transfer structure comprises forming trenches around the microchips down to the transfer substrate;
  the separation of the microchips from the transfer substrate comprises a laser irradiation of the transfer substrate on the microchips, perpendicularly thereto, to obtain a separation thereof from the transfer substrate.

In this variation, the growth substrate thus plays the role of a handle substrate, thus sparing a manufacturing/placing step.

According to an embodiment:
  the microchip array of the transfer structure has a first repetition pitch;
  the electric connections of the fourth substrate are arranged in an array with a second repetition pitch larger than the first repetition pitch;
  the placing of the transfer structure, the bonding of the microchips to the first surface of the fourth substrate, and the separation of the microchips from the transfer substrate, comprise:
    placing the transfer structure in a first position of the fourth substrate;
    securing at least one first microchip at the first position;
    placing the transfer structure in a second position of the fourth substrate by shifting the transfer structure and the fourth substrate with respect to each other by the second repetition pitch;
    and securing at least one second microchip at the second position.

In other words, the method enables to manufacture the microchips with a high density, independently form the desired final pitch for the luminous panel, thereby increasing the manufacturing efficiency. The microchips are then placed with the pixel pitch desired for the luminous panel.

According to an embodiment, the manufacturing of the control circuits in the second substrate is performed according to an ASIC manufacturing technique, this technology allowing a high efficiency, a high density of components per surface area unit, while providing a large freedom of design of the electronic micro-LED control diagram (number of transistors, capacitors, electric connections, etc.). Further, this technology requires no investment as significant as that necessary to be equipped with machines capable of manufacturing large active TFT arrays.

According to an embodiment, the fourth substrate only comprises electric connections. Thus, the only element of the luminous panel which is possibly manufactured in one piece comprises no active element (transistors, for example). Thus, even if it has a large surface area, its cost is limited.

According to an embodiment, the stack forming the micro-LEDs of the first substrate is made of III-V semiconductor, particularly based on gallium, particularly of gallium nitride (GaN), and/or of gallium phosphide (GaP) and/or of indium gallium nitride (InGaN), and/or of aluminum gallium nitride (AlGaN), and/or of indium gallium arsenide (InGaAs), and/or of aluminum gallium arsenide (AlGaAs), and/or of gallium arsenide phosphide (GaAsP). This type of semiconductor material enables to manufacture micro-LEDs emitting in red (e.g.: GaAsP; InGaP), in blue (e.g.: InGaN with between 10% and 20% of In), and in green (e.g.: InGaN with more than 20% of In, GaP, AlGaP). It is thus possible to form luminous elements emitting by themselves the wavelength desired for the luminous panel, and thus to do away with currently-used colored filters.

In particular, for the manufacturing of a luminous image display panel, thus comprising three luminous elements per image point (one for each red, green, and blue color), the method enables to independently form three arrays of microchips, one per color, and to achieve their subsequent placing on the fourth substrate at the location desired for the luminous panel. As a variation, for each growth substrate having micro-LEDs of a given color manufactured thereon, a silicon substrate with the control electronics is placed, after which the microchips of different colors thus obtained are placed as described previously.

The invention also aims at a luminous panel comprising:
  a substrate comprising electric connections;
  an array of microchips secured to the substrate and connected to the electric connections in order to be driven, each microchip comprising a stack:
    of an active control circuit based on transistors formed in a silicon volume, said circuit being connected to the electric connections of the substrate;
    and of a micro-LED secured to the control circuit and connected thereto in order to be controlled.

In other words, the luminous panel according to the invention enables to form brighter displays, with a lambertian emission (and thus with no viewing angle issue), having a better power efficiency, and potentially on transparent substrates.

According to an embodiment, the micro-LEDs are made of III-V semiconductor, particularly based on gallium, particularly of gallium nitride (GaN), and/or of gallium phosphide (GaP) and/or of indium gallium nitride (InGaN), and/or of aluminum gallium nitride (AlGaN), and/or of indium gallium arsenide (InGaAs), and/or of aluminum gallium arsenide (AlGaAs) and/or of gallium arsenide phosphide (GaAsP), and/or of indium gallium aluminum phosphide InGaAlP.

BRIEF DESCRIPTION OF THE DRAWINGS

The present invention will be better understood on reading of the following description provided as an example only in relation with the accompanying drawings, where the same reference numerals designate the same or similar elements, among which.

DETAILED DESCRIPTION OF THE SPECIFICATION

Figure 1:
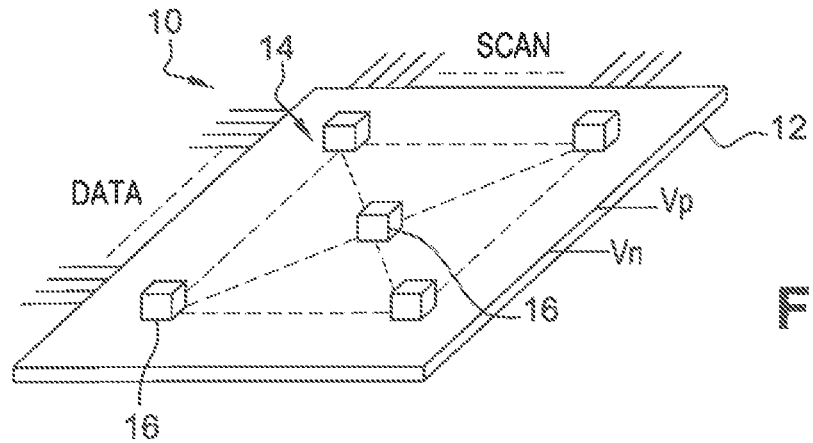
FIG. 1 is a simplified perspective view of luminous panel according to the invention.

In the following, terms "lower" and "upper" refer to the relative layout of elements illustrated in the drawings.

Figure 2:
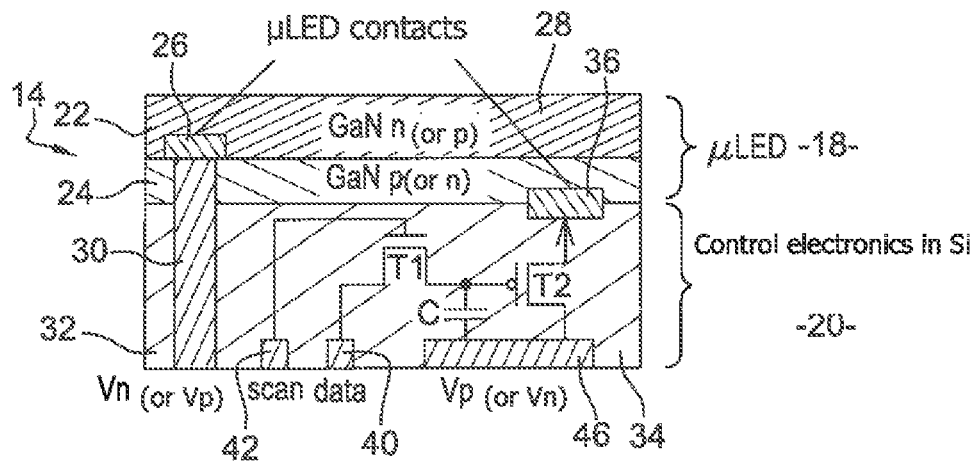
FIG. 2 is a simplified cross-section view of a microchip comprised in the structure of the panel according to the invention.
Figure 3:
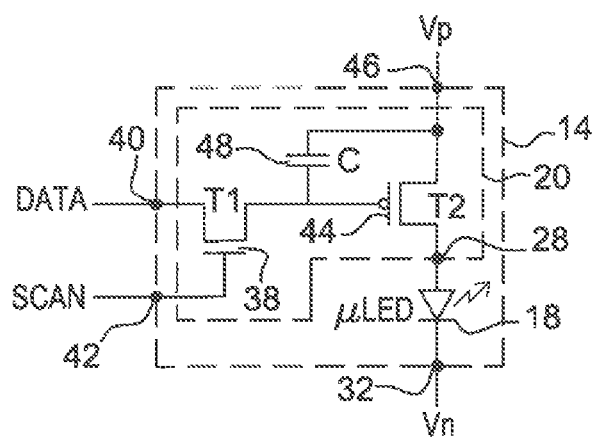
FIG. 3 is an electric diagram illustrating a micro-LED and its control circuit.

Referring to FIGS. 1 to 3, a luminous panel 10 according to an embodiment of the invention, for example, for a display screen (of computers, smartphones, television sets, tablets . . . ) or for an image projector, comprises:
  a passive electric connection substrate 12, that is, only comprising electric conductors, e.g. electric contacts and tracks, to supply panel control signals DATA and SCAN and for supplying power supply voltages Vp and Vn; and
  an array 14 of light-emitting microchips 16 secured to passive substrate 12 and connected to the electric connectors thereof, the microchips being spatially arranged, for example, for an image display.

Each microchip 16 comprises, on an upper portion, an inorganic semiconductor micro-LED 18 and, on a lower portion, secured to the upper portion, an active control circuit 20 formed in a silicon block. In particular, the control circuit is not formed according to the TFT technology.

More particularly, micro-LED 18 comprises at least one homojunction or one heterojunction, for example, a PN junction formed of a stack of an upper P-type (or N-type) semiconductor layer 22 and of a lower N-type (respectively P-type) semiconductor layer 24, and two electric contacts 26, 28 for injecting an electric current through the stack, to generate light. Advantageously, micro-LED 18 is made of III-V semiconductor, particularly based on gallium, particularly of gallium nitride (GaN), and/or of gallium phosphide (GaP) and/or of indium gallium nitride (InGaN), and/or of aluminum gallium nitride (AlGaN), and/or of aluminum gallium arsenide (AlGaAs), and/or of indium gallium arsenide (InGaAs), and/or of gallium arsenide phosphide (GaAsP). This type of semiconductor material enables to manufacture micro-LEDs emitting in red (e.g.: AlGaAs, GaAsP, InGaAlP), in blue (e.g.: InGaN), and in green (e.g.: GaN, GaP, AlGaP). Of course, the structure of micro-LED 18 cannot be reduced to the stack of two N and P layers, for example, made of GaN, and may take any known shape, for example, a "planar" architecture, a "MESA"-type architecture, an architecture based on nanowires, such as described in document WO 2012/035243 and/or WO 2012/156620, etc. . . . .

A contact transfer 30 is further provided through microchip 14 to electrically connect one of electric contacts 26 of micro-LED 18 to an electric contact 32 arranged on lower surface 34 of control circuit 20. Contact transfer 30 for example is of "TSV" type ("through silicon via") and comprises for this purposes a hole crossing the microchip from contact 26 to surface 34, which hole has its wall coated with a layer of electric insulator, for example, a dielectric layer, and is filled with an electrically conductive material, for example, a metal. The other contact 28 of micro-LED 18 is for example arranged on lower surface 36 of micro-LED 18, at the interface with the upper surface of control circuit 20.

Control circuit 20 comprises electronic components (transistor(s), capacitor(s), resistors, etc.) for the individual control of micro-LED 18 according to control signals DATA and SCAN. Such an individual control enables to actively address each micro-LED. For example, referring to FIG. 3, control circuit 20 comprises:
  a first PMOS transistor 38, having its drain connected to an output contact 40 of microchip 14 to receive a signal DATA setting the state of micro-LED 18 (on or off, for example) and having its gate connected to an output contact 42 of microchip 14 to receive a signal SCAN enabling or not to update the state of micro-LED 18;
  a second NMOS transistor 44, having its gate connected to the source of first PMOS transistor 38, having its drain connected to an output contact 46 of the LED microchip for the application of a second power supply voltage Vp, and having its source connected to contact 28 of micro-LED 18. Second transistor 44 thus allows the connection of micro-LED 18 and the application of voltage different Vp-Vn between contacts 32 and 28, and thus the injection of current into micro-LED 18; and
  a capacitor 48 connected between the gate and the drain of second transistor 44, to maintain the state of micro-LED 18 between two refreshments.

Figure 4:
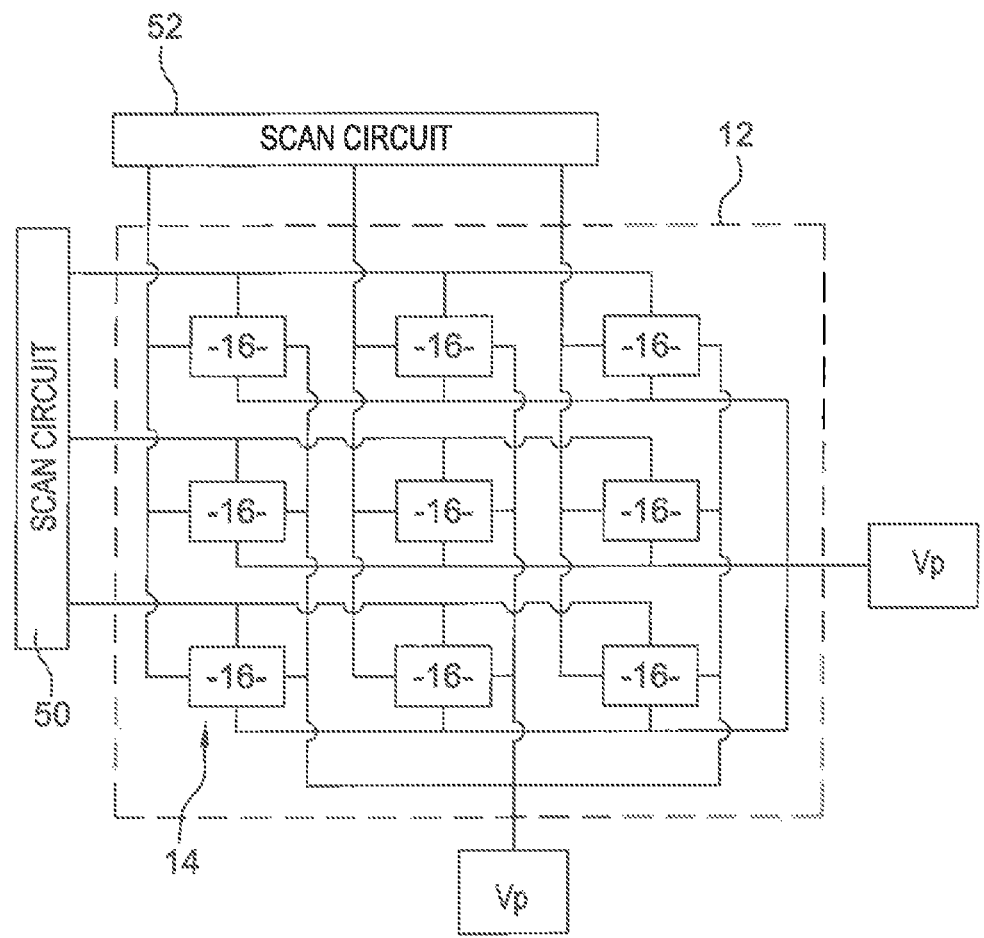
FIG. 4 is an electric diagram illustrating connections of an interconnection substrate according to the invention.

FIG. 4 illustrates a diagram of connection and control of the panel thus described, here, a panel comprising an array 14 of 3 rows and 3 columns of microchips 16, connection substrate 12 being connected to a circuit 50 of row-by-row refreshment of array 14, a circuit 52 controlling the state of illumination of the micro-LEDs of the row selected by circuit 50, and voltage sources Vp and Vs.

A first embodiment of a method of manufacturing a luminous panel according to the invention, for example, a panel such as described hereabove, will now be described in relation with FIGS. 5A-5I.

Figure 5A:
FIGS. 5A-5J illustrate a first embodiment of the method of manufacturing a luminous panel according to the invention.

The method starts with the manufacturing of an array of active control circuits 20 in a silicon substrate 60, for example, according to an ASIC ("application-specific integrated circuit") manufacturing technology, well known per se of the state of the art (FIG. 5A).

Circuits 20 are spaced by at least a distance Δ selected to form a trench around each circuit 20 to be able to subsequently individualize them. Distance Δ is for example selected according to the accuracy of the trench manufacturing process, which thus allows a maximum density of circuits 20 considering said process.

Figure 5B:
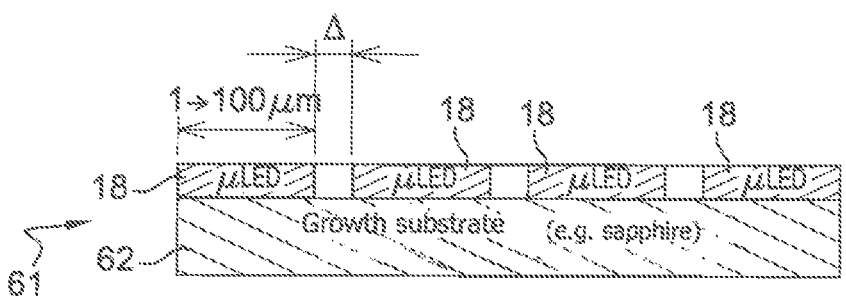

Independently from the manufacturing of the array of control circuits 20, the method comprises manufacturing a second substrate 61 comprising a stack of semiconductor layers and of electric contacts forming the array of micro-LEDs 18. The manufacturing of the stack of semiconductor layers forming the micro-LEDs, for example, two GaN layers, respectively of type P and N, is for example formed by epitaxy on a growth substrate 62 (e.g. made of sapphire or of silicon), as well known in the state of the art (FIG. 5B).

For example, micro-LEDs 18 are manufactured according to a technique described in document Journal of Crystal Growth 268 (2004) 527-530.

Figure 5C:

Referring to FIG. 5C, the array of control circuits 20 and the array of micro-LEDs 18 are then placed on each other and secured to each other, for example, by means of a direct heterogeneous bonding or by a "flip-chip"-type hybridization using solder bumps, and a thermocompression and/or by using hollow microtubes, such as those described in document WO 2013/001225 or in document FR 2 928 033. The interconnection of the arrays is thus performed to connect contact 28 of each micro-LED with the corresponding terminal of transistor 44 of the associated control circuit. TSV-type contact transfers 30 are then formed to transfer each contact 26 of the micro-LEDs to the free surface of the control circuits. Growth substrate 62 is then removed, for example, by laser lift-off in the case of a sapphire substrate, or by mechanical polishing and chemical etching with KOH in the case of a Si substrate.

Figure 5D:
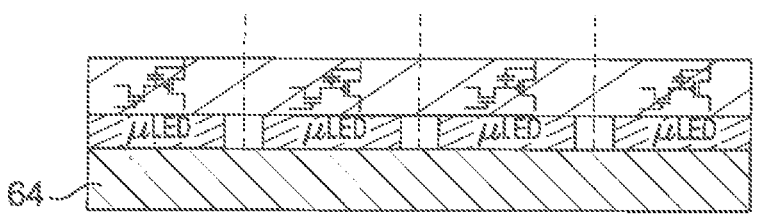

Third substrate 63, thus formed of the stacking of the arrays of micro-LEDs and of control circuits, is then transferred onto a so-called "handle" substrate 64, for example, made of Si, by means of a so-called "temporary" bonding, allowing an easy subsequent removal, for example, by means of a resin, particularly a Brewer's "WaferBOND® HT-10.10" resin (FIG. 5D).

Figure 5E:
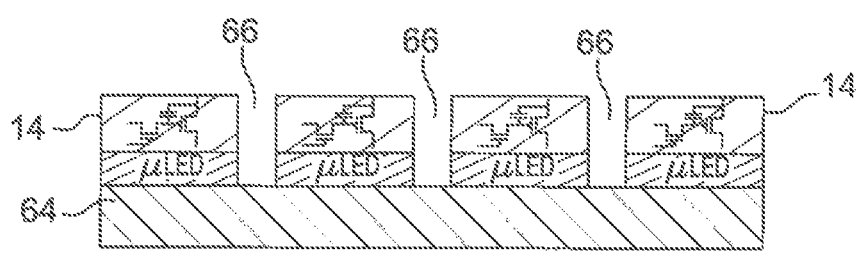

The method carries on with the individualization of each microchip 14 by etching around each of them a trench 66 down to handle substrate 64, for example, a RIE ("Reactive Ion Etching") by ICP ("Inductive coupled plasma": RIE mode which provides a more directional etching) with $Cl_2$ (FIG. 5E).

Independently, at the previously-described steps, the method comprises manufacturing a fourth passive substrate 68 having the dimensions desired for the panel, and comprising a network of electric connections for the electric connection of contacts 32, 40, 42 and 46 provided on lower surface 34 of each control circuit 20, for example, a glass plate having electric tracks made of indium tin oxide (or "ITO") formed on a surface thereof.

Figure 5F:
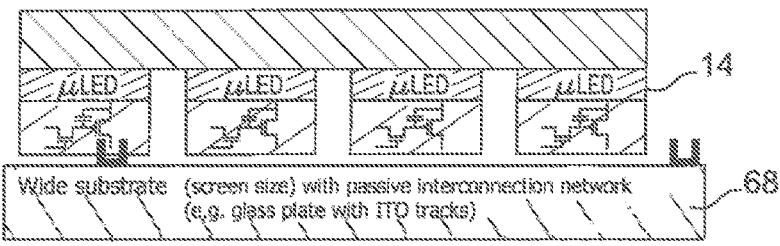
Figure 5G:
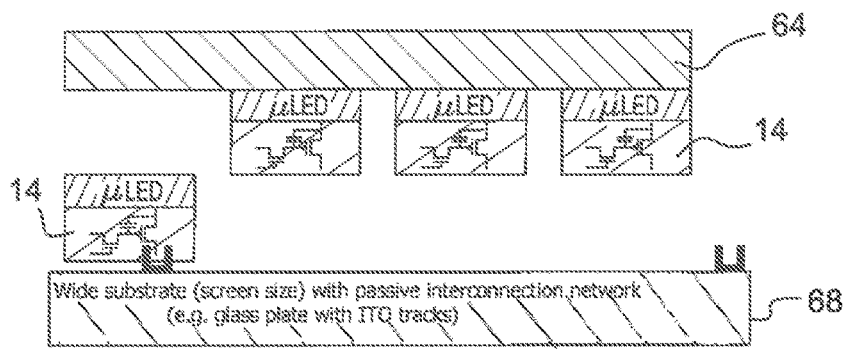
Figure 5H:
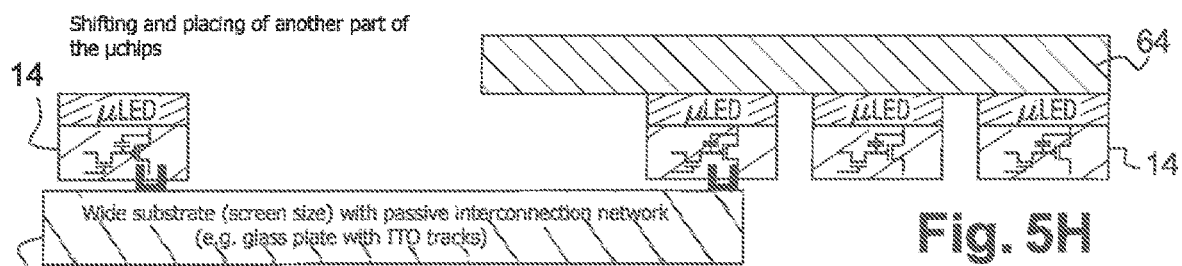
Figure 5I:
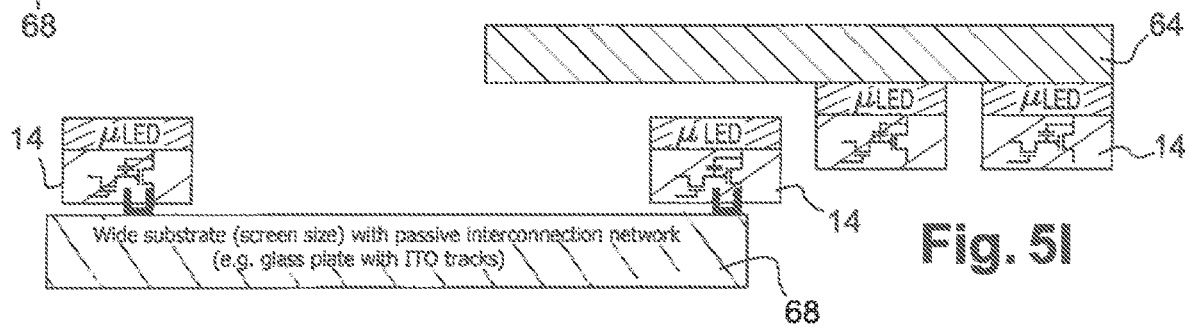

Microchips 14, attached to handle substrate 64 by their micro-LEDs 18, are then placed on substrate 68, and secured to electrically connect the electric connections of the control circuits to the corresponding electric connections of substrate 68, for example, by means of a direct heterogeneous bonding, or of a flip-chip hybridization such as previously described (FIG. 5F). Microchips 14 are then separated from handle substrate 64 by heating, for example up to 300° C.

Figure 5J:
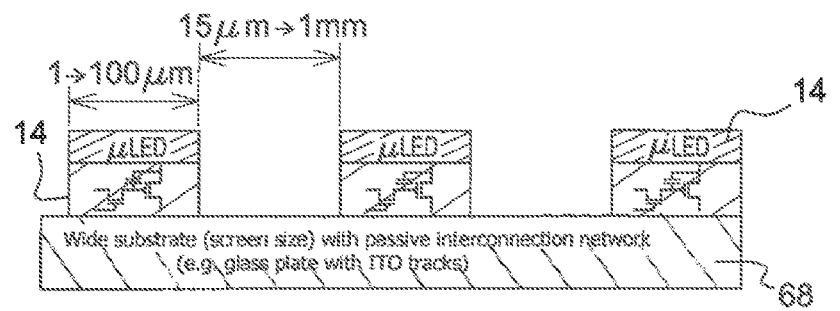
Figure 6A:
FIGS. 6A-6I illustrate a second embodiment of the method of manufacturing a luminous panel according to the invention.
Figure 6B:
Figure 6C:
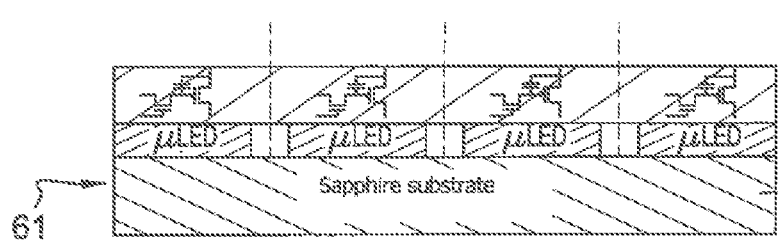
Figure 6D:
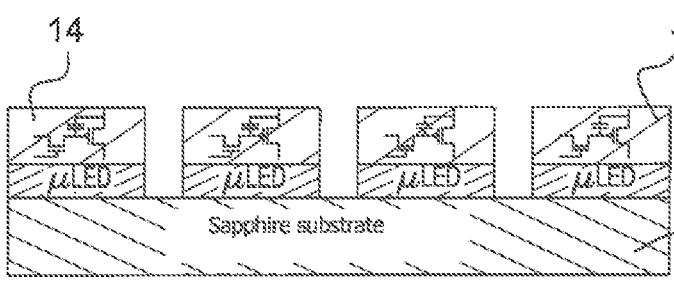
Figure 6E:
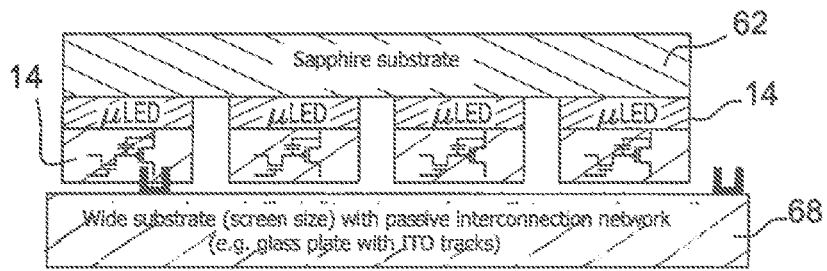
Figure 6F:
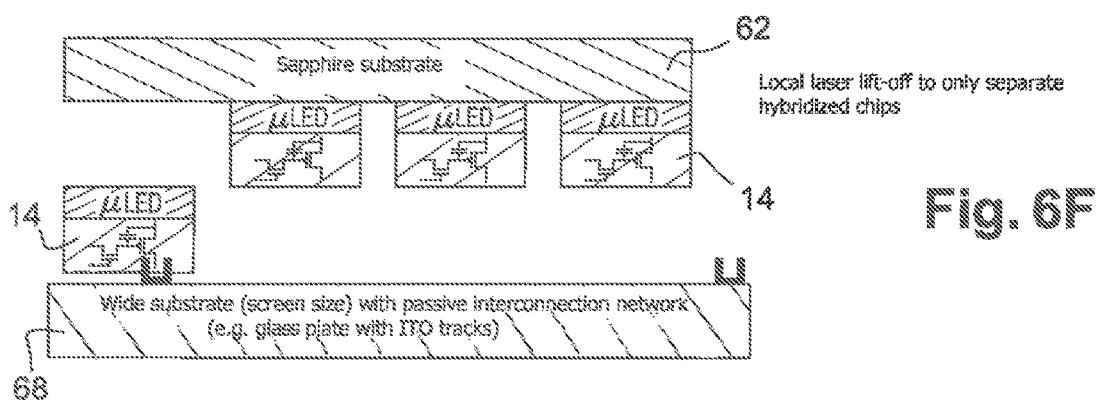
Figure 6G:
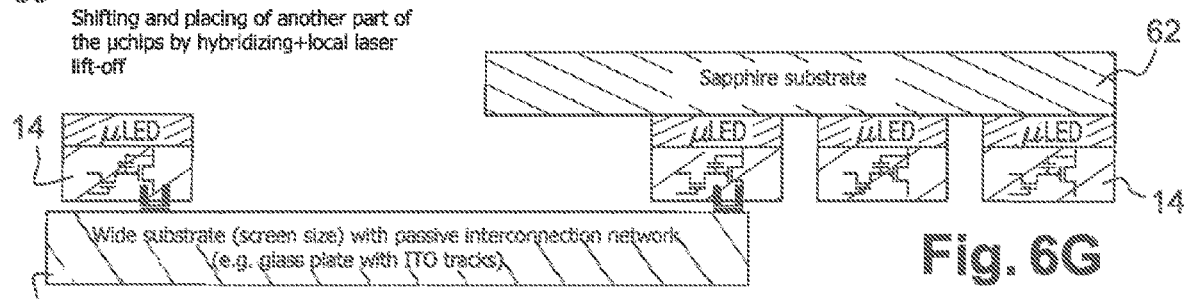
Figure 6H:
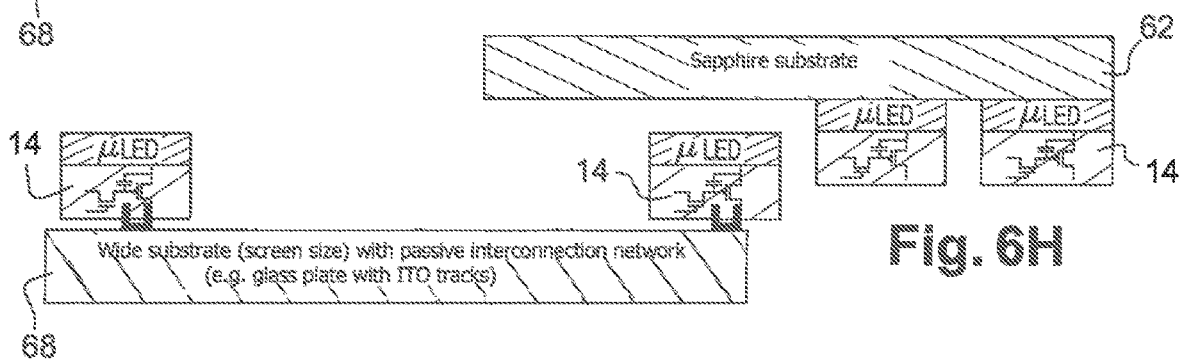
Figure 6I:
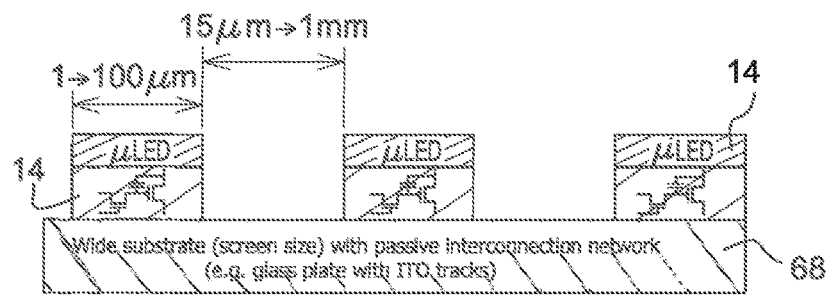

Since the pitch of microchips 14 on handle substrate 64 (in the order of some ten micrometers with current manufacturing techniques, for example, 30 μm) may be greater than the pitch of the array of microchips of the luminous panel (currently in the order of some hundred micrometers, for example, in the range from 15 micrometers to 1 millimeter), the method for example comprises placing part of the microchips on passive substrate 68 (FIG. 5G) and then shifting the handle substrate with the remaining microchips by the pitch of the luminous panel, placing another part of the microchips (FIGS. 5H, 5I), and so on, until the luminous panel is completed (FIG. 5J).

In this first embodiment, a handle substrate is used to place microchips 14 on passive connection substrate 68. The use of a handle substrate 64, adhering to microchips 14 by temporary bonding, has the advantage of enabling to remove the growth substrate, whichever it may be. It however assumes a manufacturing step and an additional placing step.

According to a second embodiment of the method according to the invention, illustrated in FIGS. 6A-6I, growth substrate 62 is not removed once the first and second substrates 60, 61 have been interconnected to each other, as in FIG. 5C, but is used as a handle substrate, which enables to spare a manufacturing and placing step, and to ease the alignment of microchips 14 on array 68. Microchips 14 are then separated from growth substrate 62 by the use of a local laser lift-off, FIG. 6F, such as for example described in U.S. Pat. No. 6,071,795 (i.e. use of a pulsed 248-nm KrF laser and exposure of the μLEDs with energies between 100 and 600 mJ/$cm^2$). For μLEDs, a lens may enable to focus the laser beam at the interface between the sapphire and the GaN.

For the above-described embodiments of the manufacturing method, applied to the manufacturing of a luminous panel to display color images, it may be started by placing microchips corresponding to the blue pixels, by positioning the interconnects where appropriate for the blue pixels, after which interconnects may be added to place the green pixels, after which interconnects may be added to place the red pixels.

Further, the interconnects between microchips 14 and interconnection substrate 68 may be copper microtubes or micropillars (so-called "micro-bump" technology) or copper connection pads to perform the direct bonding between pads (e.g. heterogeneous or by thermocompression).

A specific control circuit, particularly inducing four electric connections per microchip, has been described. Of course, any type of active control circuit can be envisaged. One may in particular provide a last interconnection level in the ASIC manufacturing method in order to have a planar surface. In particular, after the methods of manufacturing transistors in silicon, the resulting surface may be non-planar. To ease the interconnection between the active silicon array and the micro-LED array (e.g., made of GaN), it is preferable for the surfaces placed on each other to be planar. To achieve this, a last level on the active array is formed, by depositing a dielectric insulator (e.g. $SiO_2$), etching it, having the etchings emerge at the level of the connections, depositing Cu to fill the etch holes, and finishing with a CMP ("chemical mechanical polishing") to have a planar surface. This type of technology is generally known as "damascene".

The invention claimed is:

1. A method of manufacturing a luminous panel comprising steps of:
   manufacturing a first substrate comprising:
   a stack of semiconductor layers forming inorganic semiconductor micro-LEDs; and
   an array of electric connections for the micro-LEDs,
   the manufacturing of the first substrate being carried out in such a way that the electric connections are arranged on a first surface of the first substrate;
   manufacturing in a second silicon substrate, independently from the first substrate, an array of circuits for controlling the micro-LEDs comprising transistors, said manufacturing in the second silicon substrate being carried out so that:
   first connections for control of the micro-LEDs are arranged on a first surface of the second substrate;
   and second connections for driving of the luminous panel are arranged on a second surface of the second substrate;
   placing the first surfaces of the first substrate and of the second substrate on one another and securing said first surfaces of the first substrate and of the second substrate to each other, to electrically connect electric connections of the micro-LEDs with the first connections, thus obtaining a third substrate comprising an array of electronic microchips, each of the array of electronic microchips formed of a stacking of a micro-LED and of a control circuit;

manufacturing a microchip transfer structure comprising: a transfer substrate;

and the array of electronic microchips, each of the array of electronic microchips being secured to the transfer substrate only by its micro-LED, and individualized by forming a trench into the third substrate around the microchip;

manufacturing a fourth substrate, independently from the transfer structure, comprising electric connections for supplying signals for driving the luminous panel, said electric connections of the fourth substrate being arranged on a first surface of the fourth substrate; and placing the transfer structure on the first surface of the fourth substrate, securing the microchips to the first surface of the fourth substrate to connect the second connections with the electric connections of the fourth substrate, and separating the microchips from the transfer substrate.

2. The luminous panel manufacturing method of claim 1, wherein the step of manufacturing the microchip transfer structure comprises steps of:

placing and temporarily bonding the third substrate to the transfer substrate; and then, forming the trenches around the microchips down to the transfer substrate.

3. The luminous panel manufacturing method of claim 1, wherein:

the manufacturing of the first substrate comprises manufacturing a growth substrate and growing by epitaxy semiconductor layers forming the micro-LEDs, the growth substrate forming the transfer substrate of the microchip transfer structure;

the manufacturing of the microchip transfer structure comprises forming trenches around the microchips down to the transfer substrate; and the separation of the microchips from the transfer substrate comprises a laser irradiation of the transfer substrate on the microchips, perpendicularly thereto, to obtain a separation thereof from the transfer substrate.

4. The luminous panel manufacturing method of claim 1, wherein:

the array of electronic microchips exhibits a first repetition pitch;

the electric connections of the fourth substrate are arranged in an array with a second repetition pitch larger than the first repetition pitch;

the manufacturing of the microchip transfer structure, the securing of the microchips to the first surface of the fourth substrate, and the separation of the microchips from the transfer substrate steps, comprise steps of:

placing the transfer structure in a first position of the fourth substrate;

securing at least one first microchip at the first position;

placing the transfer structure in a second position of the fourth substrate by shifting the transfer structure and the fourth substrate with respect to each other by the second repetition pitch; and and securing at least one second microchip at the second position.

5. The luminous panel manufacturing method of claim 1, wherein the fourth substrate consists of only electric connections.

6. The luminous panel manufacturing method of claim 1, wherein the stack forming the micro-LEDs of the first substrate is made of at least one of gallium nitride, indium gallium nitride, and aluminum gallium nitride.

* * * * *